United States Patent
Yamamoto et al.

(10) Patent No.: US 9,953,748 B2
(45) Date of Patent: Apr. 24, 2018

(54) ELECTRIC WIRE PROTECTING DEVICE

(71) Applicant: MITSUBISHI AIRCRAFT CORPORATION, Aichi (JP)

(72) Inventors: Syusaku Yamamoto, Tokyo (JP); Ko Yatabe, Aichi (JP)

(73) Assignee: MITSUBISHI AIRCRAFT CORPORATION, Aichi (JP)

( * ) Notice: Subject to any disclaimer, the term of this patent is extended or adjusted under 35 U.S.C. 154(b) by 0 days.

(21) Appl. No.: 15/387,791

(22) Filed: Dec. 22, 2016

(65) Prior Publication Data

US 2017/0221606 A1    Aug. 3, 2017

(30) Foreign Application Priority Data

Feb. 1, 2016    (JP) .................................. 2016-016889

(51) Int. Cl.
| | |
|---|---|
| *B64D 45/02* | (2006.01) |
| *H01B 9/02* | (2006.01) |
| *H01B 9/00* | (2006.01) |
| *H01B 7/36* | (2006.01) |
| *H01B 7/42* | (2006.01) |
| *H02H 1/00* | (2006.01) |
| *G01R 31/02* | (2006.01) |
| *H02G 3/04* | (2006.01) |

(52) U.S. Cl.
CPC .............. *H01B 9/006* (2013.01); *B64D 45/02* (2013.01); *G01R 31/025* (2013.01); *H01B 7/361* (2013.01); *H01B 7/428* (2013.01); *H01B 9/02* (2013.01); *H02H 1/0015* (2013.01); *H02G 3/0481* (2013.01)

(58) Field of Classification Search
CPC ........ H01B 9/006; H01B 7/361; H01B 7/428; H01B 9/02; H02H 1/0015
USPC .................................. 174/113 C, 110 R, 135
See application file for complete search history.

(56) References Cited

U.S. PATENT DOCUMENTS

| | | | | |
|---|---|---|---|---|
| 483,285 | A * | 9/1892 | Guilleaume | H01B 11/002 174/113 C |
| 1,977,209 | A * | 10/1934 | Sargent | H01B 7/1875 174/110 R |
| 3,819,443 | A * | 6/1974 | Simons | B32B 15/08 156/204 |
| 5,952,615 | A * | 9/1999 | Prudhon | H01B 11/06 174/113 C |
| 6,787,697 | B2 * | 9/2004 | Stipes | H01B 11/04 174/113 C |

(Continued)

FOREIGN PATENT DOCUMENTS

JP    2001-045652 A    2/2001

*Primary Examiner* — Timothy Thompson
*Assistant Examiner* — Michael F McCallister
(74) *Attorney, Agent, or Firm* — Pearne & Gordon LLP (57) ABSTRACT

An electric wire protecting device is used in order to be capable of being installed in a narrow wiring area like one in a small aircraft, and to minimize a risk of an electric arc inside electric wire bundles at low costs. To this end, the electric wire protecting device includes: power wire groups each of which is an assembly of one or more power wires at the same potential; a tape for binding the power wire groups at different potentials from one another into one bundle at a constant pitch; and a spacer extending in a direction of extension of the power wire groups, and inserted in boundaries between the power wire groups.

8 Claims, 9 Drawing Sheets

(56) References Cited

U.S. PATENT DOCUMENTS

| | | | | |
|---|---|---|---|---|
| 7,375,284 B2* | 5/2008 | Stutzman | ............... | H01B 11/06 174/110 R |
| 7,637,776 B2* | 12/2009 | McNutt | ................. | H01B 11/06 174/113 R |
| 2004/0055781 A1* | 3/2004 | Cornibert | ............... | H01B 11/06 174/135 |
| 2004/0124000 A1* | 7/2004 | Stipes | .................... | H01B 11/04 174/113 C |
| 2016/0362074 A1* | 12/2016 | Yamaguchi | ......... | B60R 16/0215 |

* cited by examiner

ELECTRIC WIRE PROTECTING DEVICE

TECHNICAL FIELD

The present invention relates to an electric wire protecting device for detecting an electric arc which may occur in an electric wire in an aircraft, a train, an automobile, a ship, a photovoltaic power generating system, and the like.

BACKGROUND ART

To secure the safety of such vehicles and systems, including an aging aircraft, which have been used for a long time, it is necessary to minimize a heat risk on a structure (fuel pipes, hydraulic pipes, fuel tanks, and the like) which allows an inflammable liquid to pass through.

The wiring is often designed such that electric wires at different potentials are bound into a single bundle. In an electric wire bundle of this type, adjacent electric wires rub against one another due to aircraft vibrations and the like. There is a risk that the rubbing of the electric wires for a long time may cause further wear of insulations of the electric wires, eventually resulting in an arc fault occurring between electric wires, particularly power supply wires (power wires), at different potentials within the electric wire bundle.

As a first measure to counter the risk, an arc fault circuit breaker is employed which is designed to determine whether or not an electric arc occurs based on the waveform of the electric current or voltage, and to be capable of disconnecting circuits in a moment once the electric arc occurs.

As a second measure to counter the risk, a method is employed in which: electric wires at different potentials are spaced out; and each group of electric wires at the same potential are bound into a single electric wire bundle. This method can eliminate a risk that wires wear due to their rubbing, and minimize a risk of the occurrence of an electric arc.

As a third measure to counter the risk, electric wires are protected by winding an ark protection sleeve around the electric wires in a predetermined length.

CITATION LIST

Patent Literature

{Patent Literature 1} Japanese Patent Application Publication No. 2001-45652

SUMMARY OF INVENTION

Technical Problem

The electric arc fault circuit breaker used as the first measure, however, is expensive, and involves a risk of a malfunction caused by noise.

Meanwhile, the second measure, in which the electric wires at different potentials are spaced out and each group of electric wires at the same potential are bound into a bundle, vastly increases the number of electric wire bundles, and requires a large area for wiring design. Thus, the second measure makes it impossible to install such electric wire bundles in a small aircraft.

Furthermore, the third measure, in which the electric arc protection sleeve is wound around the electric wire bundles, confines heat under the sleeve. Thus, the third measure allows the temperature of the electric wires to rise, and accelerates deterioration of the electric wires with time.

Incidentally, Patent Literature 1 discloses a technique for detecting the occurrence of an electric arc by sensing changes in heat, light, smell or magnetism once the electric arc occurs.

Solution to Problem

The present invention has been made with the foregoing technical problems taken into consideration. An object of the present invention is to provide an electric wire protecting device capable of being installed in a narrow wiring area like one in a small aircraft, and capable of minimizing a risk of an electric arc inside electric wire bundles at low costs.

An electric wire protecting device according to a first invention which solves the above problems includes: a power wire group which is an assembly of one or more power wires at a same potential; a tape for binding a plurality of the power wire groups at different potentials from one another into one bundle at a constant pitch; and a spacer extending in a direction of extension of the power wire groups, and inserted in boundaries between the power wire groups.

The electric wire protecting device according to a second invention which solves the above problems is the electric wire protecting device according to the first invention, wherein the spacer includes a conductive film extending in the direction of the extension of the power wire groups, and inserted in the boundaries between the power wire groups, and an insulating cover for covering the film, the electric wire protecting device further including a detection circuit for detecting whether or not an electric arc occurs based on a current flowing in the film.

The electric wire protecting device according to a third invention which solves the above problems is the electric wire protecting device according to the second invention, wherein the film is connected to the detection circuit via a resistor for controlling a short-circuit current such that when an electric arc occurs, no energy penetrates through the film.

The electric wire protecting device according to a fourth invention which solves the above problems is the electric wire protecting device according to the first invention, wherein the spacer includes shielding sleeves binding the power wire groups, respectively, the electric wire protecting device further including: a detection circuit for detecting whether or not an electric arc occurs based on currents flowing in the shielding sleeves.

The electric wire protecting device according to a fifth invention which solves the above problems is the electric wire protecting device according to the fourth invention, wherein the shielding sleeves are connected to the detection circuit via a resistor for controlling short-circuit currents such that when an electric arc occurs, no energy penetrates through the shielding sleeves.

The electric wire protecting device according to a sixth invention which solves the above problems is the electric wire protecting device according to the first invention, wherein the spacer is an insulating hollow member, and including a hollow portion formed to extend in the direction of the extension of the power wire groups, and to be inserted into the boundaries between the power wire groups, and a weak-current wire group which is an assembly of weak-current wires extending in the direction of the extension of the power wire groups is arranged in the hollow portion.

The electric wire protecting device according to a seventh invention which solves the above problems is the electric wire protecting device according to the sixth invention, further including: a detection circuit, connected to the weak-current wire group, for detecting whether or not an electric arc occurs based on a current flowing in the weak-current wire group.

The electric wire protecting device according to an eighth invention which solves the above problems is the electric wire protecting device according to the first invention, wherein the spacer includes a heat distribution measurement film extending in the direction of the extension of the power wire groups, inserted in the boundaries between the power wire groups, and designed to change its color according to changes in temperature, and an insulating cover for covering the heat distribution measurement film.

Advantageous Effects of Invention

The electric wire protecting device of the present invention is capable of being installed in a narrow wiring area like one in a small aircraft, and capable of minimizing a risk of an electric arc inside electric wire bundles at low costs.

BRIEF DESCRIPTION OF DRAWINGS

FIGS. 4A and 4B are diagrams for describing how a weak electric arc may occur in the electric wire protecting device of Embodiment 1 of the present invention. FIG. 4B illustrates how the weak electric arc may occur.

DESCRIPTION OF EMBODIMENTS

With reference to the drawings, descriptions will be provided for electric wire protecting devices of the embodiments of the present invention. Incidentally, what the following embodiments protect from the occurrence of an electric arc is a three-phase alternating-current wire including a first power wire group 1, a second power wire group 2 and a third power wire group 3. In this respect, each power wire group is an assembly of one or more power wires at the same potential.

As an example, A-phase AC 115 volts are applied to each power wire in the first power wire group 1, B-phase AC 115 volts are applied to each power wire in the second power wire group 1, and C-phase AC 115 volts are applied to each power wire in the third power wire group 1. In addition, the first to three power wire groups 1, 2, 3 each includes power wires with various diameters. The amount of electric current required differs depending on which power wire is connected to what, and the diameter of a power wire accordingly differs depending on the amount of electric power which is sent through the power wire.

Embodiment 1

Figure 1:
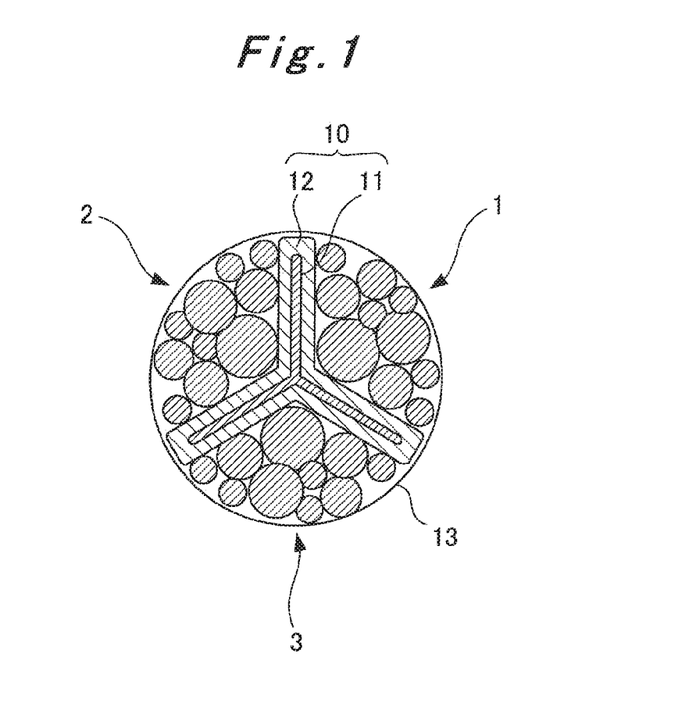
FIG. 1 is a cross-sectional view for describing a configuration of an electric wire protecting device of Embodiment 1 of the present invention.
Figure 2:
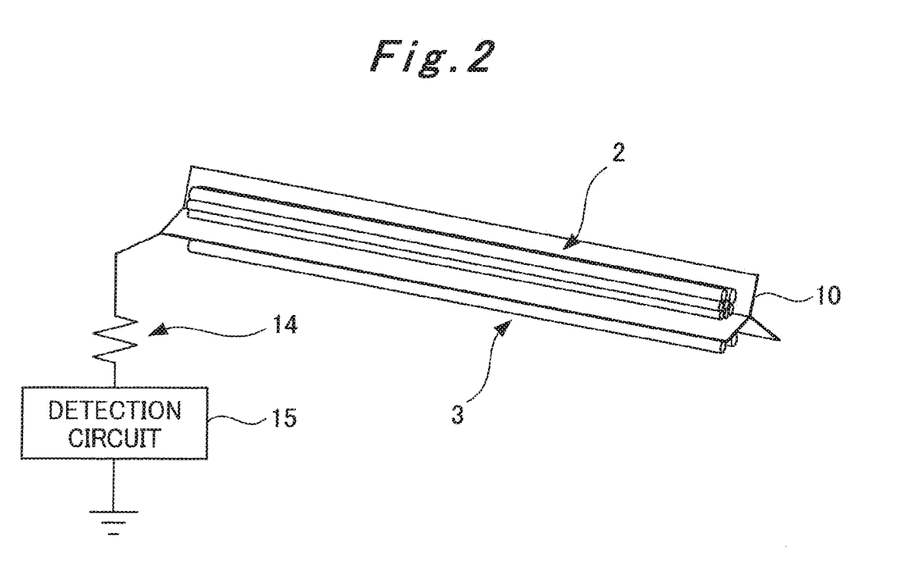
FIG. 2 is a perspective view for describing the configuration of the electric wire protecting device of Embodiment 1 of the present invention.
Figure 3:
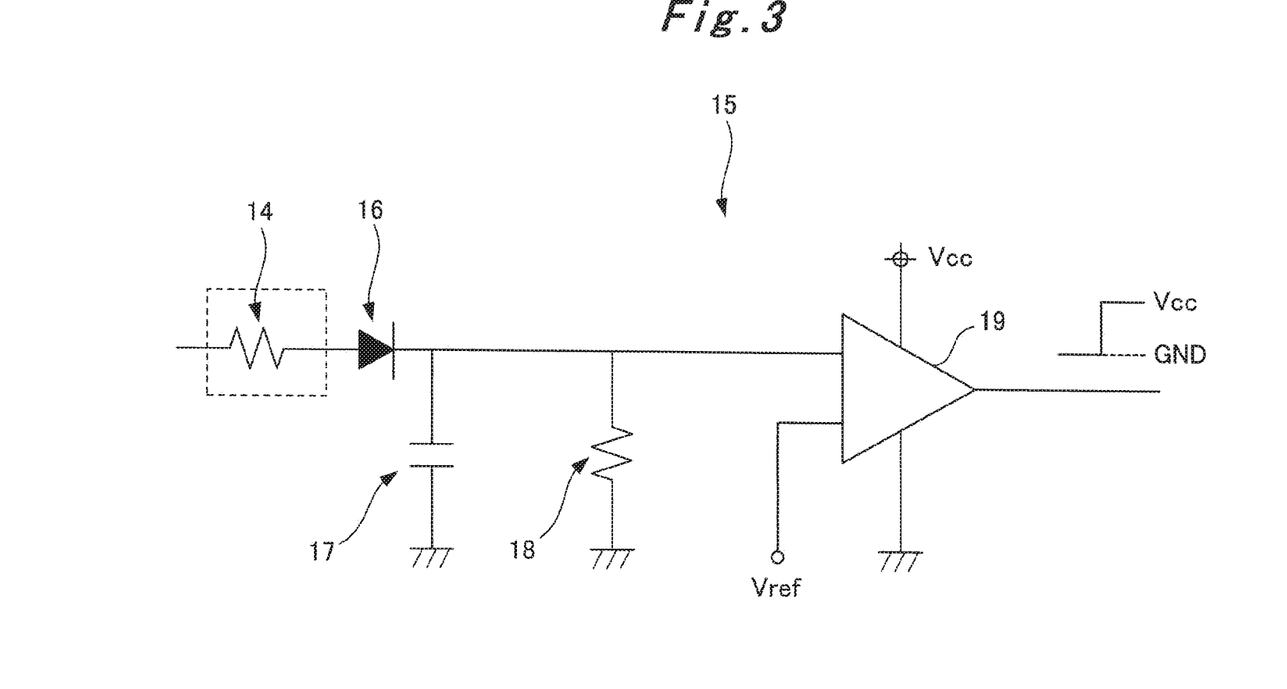
FIG. 3 is a circuit diagram for describing a configuration of a detection circuit.

Using FIGS. 1 to 3, descriptions will be provided for an electric wire protecting device of the embodiment. FIG. 1 is a cross-sectional view for describing a configuration of the electric wire protecting device of the embodiment. FIG. 2 is a perspective view for describing the configuration of the electric wire protecting device of the embodiment. FIG. 3 is a circuit diagram for describing the configuration of a detection circuit.

As shown in FIGS. 1 and 2, the electric wire protecting device of the embodiment includes a thin-film spacer 10, a tape 13, a current controlling resistor 14 and a detection circuit 15, among other things.

The tape 13 (for example, lacing tape) assembles the first to three power wire groups 1, 2, 3 at an equal pitch into a single power wire bundle.

The thin-film spacer 10 extends in a direction of the extension of the first to three power wire groups 1, 2, 3 each including an assembly of the power wires at the same potential, and is inserted into boundary portions between the first to three power wire groups 1, 2, 3.

To put it in more detail, the thin-film spacer 10 is a conductive film (metal film) 11 covered with an insulating cover (a resin cover 12), where the conductive film (metal film) 11 extends in the direction of the extension of the first to three power wire groups 1, 2, 3 each including an assembly of the power wires at the same potential, and is inserted into the boundary portions between the first to three power wire groups 1, 2, 3. In addition, the potential of the metal film 11 is a ground potential (refer to the following description about the current controlling resistor 14 and the detection circuit 15).

The current controlling resistor 14 is connected at one end to the metal film 11, and at the other end to the detection circuit 15. The detection circuit 15 is a grounded circuit for detecting whether or not an electric arc occurs based on a value of an electric current received by the detection circuit 15 from the metal film 11 via the current controlling resistor 14.

Here, detailed descriptions will be provided for the detection circuit 15. As shown in FIG. 3, the detection circuit 15 includes a rectifier diode 16, a smoothing circuit 17, an input resistor 18 and a comparator 19.

The rectifier diode 16 is connected at an input side to the current controlling resistor 14. The smoothing circuit 17 is connected at one end to the output side of the rectifier diode 16, and is grounded at the other end. The input resistor 18 is connected at one end to the output side of the rectifier diode 16 in parallel with the smoothing circuit 17, and is grounded at the other end.

The comparator 19 is connected at one input side to the output side of the rectifier diode 16 in parallel with the smoothing circuit 17 and the input resistor 18, and receives a reference voltage through the other input side. If the value of a voltage received through the one input side becomes equal to or greater than the reference voltage value Vref received through the other input side, the comparator 19 outputs a power supply voltage value Vcc as a trigger signal for warning of the occurrence of an electric arc.

Figure 4A:
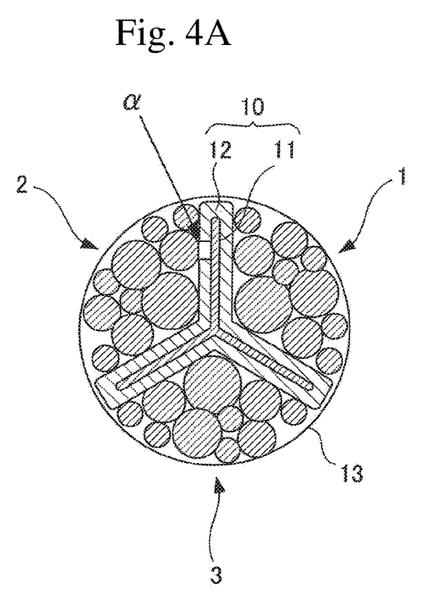
FIG. 4A illustrates where an insulation is damaged.
Figure 4B:
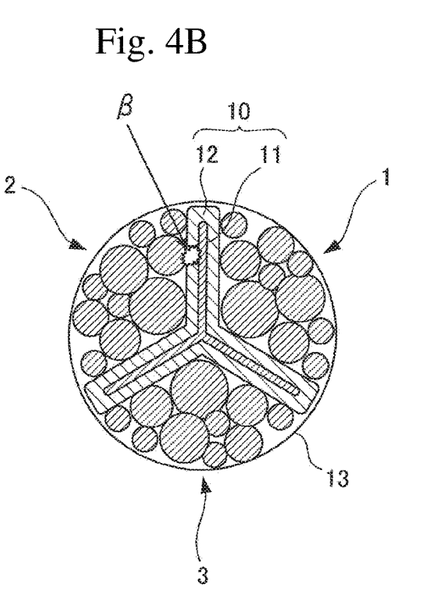
Figure 5:
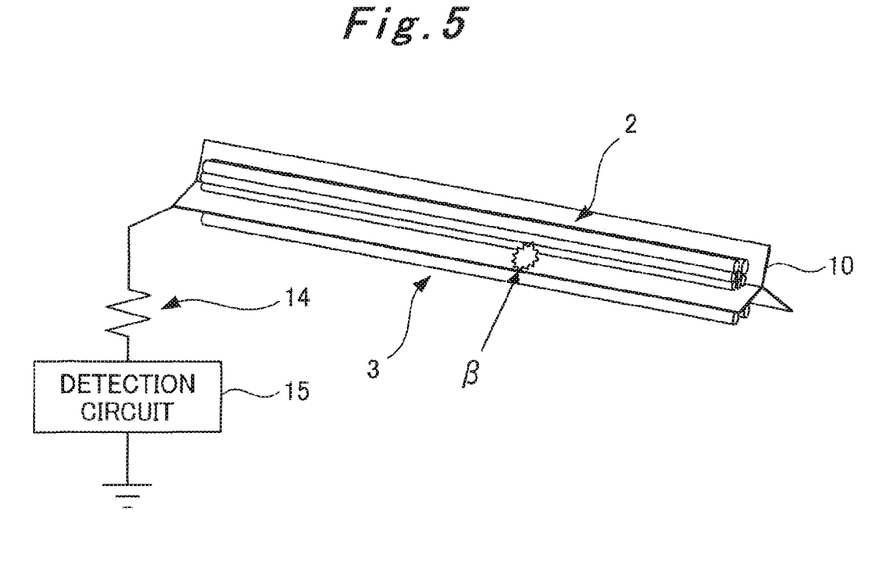
FIG. 5 is a perspective diagram for describing how the weak electric arc may occur in the electric wire protecting device of Embodiment 1 of the present invention.

The configuration of the electric wire protecting device of the embodiment is as described above. Next, using FIGS. 4A, 4B and 5, descriptions will be provided for how a weak electric arc (which would otherwise lead to an arc fault) may occur in the electric wire protecting device of the embodiment. FIGS. 4A and 4B are diagrams for describing how the weak electric arc may occur in the electric wire protecting device of the embodiment. FIG. 5 is a perspective diagram for describing how the weak electric arc may occur in the electric wire protecting device of the embodiment.

In the embodiment, as described above, the thin-film spacer 10 is provided between each neighboring two of the first to third power wire groups 1, 2, 3. For this reason, the power wires of any one of the first to third power wire groups 1, 2, 3 no longer rub against the power wires of the other power wire groups. Instead, as indicated with a reference sign α (denoting a place where an insulation is damaged), a power wire and the thin-film spacer 10 wear against and damage each other (that is to say, the insulation of a power wire and the resin cover 12 of the thin film spacer 10 wear against and damage each other).

Meanwhile, there is likelihood that in any power wire group, the insulations of some power wires wear against and damage each other. Such power wires, however, have the same potential. For this reason, even if their internal conductors come into contact with each other, the contact does not lead to an electric arc.

As indicated with a reference sign β in FIGS. 4B and 5, a weak electric arc may occur between an internal conductor of the power wire at the damaged insulation and the metal film 11. In that case, the energy of the electric arc is controlled by the current controlling resistor 14. The resistance value of the current controlling resistor 14 is adjusted such that when the electric arc occurs, the energy is weak enough not to penetrate the metal film 11.

When the weak electric arc occurs, the voltage inputted into the comparator 19 (see FIG. 3) in the detection circuit 15 becomes equal to or greater than the reference voltage value Vref. Thereby, the comparator 19 detects the occurrence of the electric arc, and outputs the trigger signal.

As described above, the embodiment makes it possible to assemble the power wire groups, which are different in potential from one another, into the same single bundle. This bundle of power wires can be installed even in narrow spaces inside an aircraft. Furthermore, the embodiment makes the power wires at any potential no longer rub against the power wires at the other potentials, and thereby can reduce a risk of the occurrence of an electric arc. Moreover, since the embodiment enables a weak electric arc to be detected using the thin-film spacer 10 and the detection circuit 15 once the weak electric arc occurs, and accordingly makes it possible to reduce manufacturing costs. Besides, unlike in a case where an arc protection sleeve is used, the embodiment no longer requires predetermined length of power wires to be wound. Thereby, the embodiment no longer allows the power wires to rise in temperature.

It should be noted that: each time a weak electric arc occurs, the embodiment records the occurrence of the weak electric arc based on the output information of the detection circuit 15; and thus, the embodiment is capable of informing necessity of replacing the power wires before power wires rub against each other to develop into an ark fault among the power wire groups.

Embodiment 2

Figure 6:
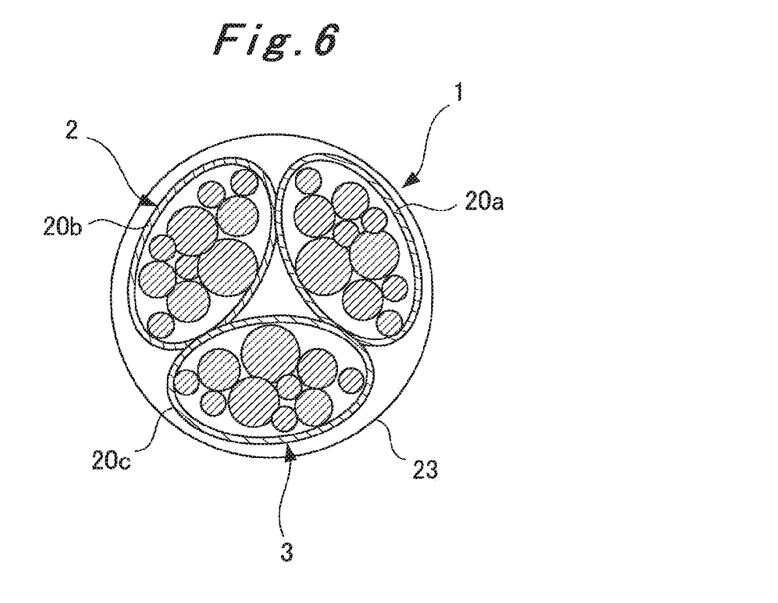
FIG. 6 is a cross-sectional view for describing a configuration of an electric wire protecting device of Embodiment 2 of the present invention.
Figure 7:
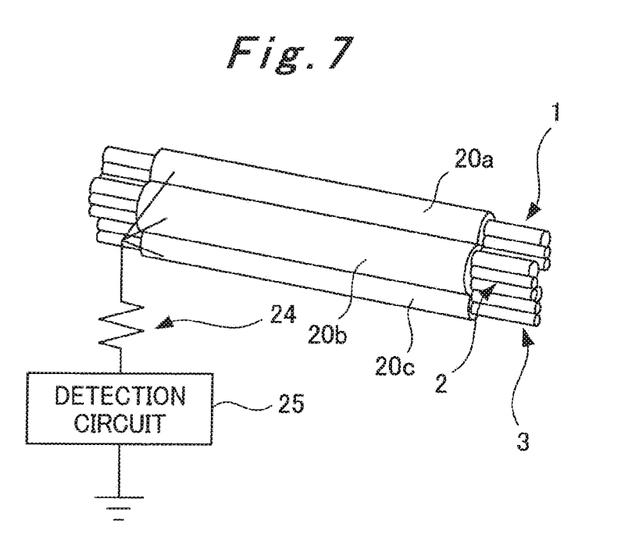
FIG. 7 is a perspective view for describing the configuration of the electric wire protecting device of Embodiment 2 of the present invention.

Using FIGS. 6 to 7, descriptions will be provided for an electric wire protecting device of the embodiment. FIG. 6 is a cross-sectional view for describing a configuration of the electric wire protecting device of the embodiment. FIG. 7 is a perspective view for describing the configuration of the electric wire protecting device of the embodiment.

The electric wire protecting device of the embodiment includes a first shielding sleeve 20a, a second shielding sleeve 20b and a third shielding sleeve 20c, a tape 23, a current controlling resistor 24 and a detection circuit 25 among other things. The current controlling resistor 24 and the detection circuit 25 are the same as the current controlling resistor 14 and the detection circuit 15 of the embodiment. For this reason, descriptions for the current controlling resistor 24 and the detection circuit 25 will be partly omitted.

The shielding sleeves 20a, 20b, 20c are made of an electromagnetic interference (EMI) material, and extend in the directions of the first to third power wire groups 1 to 3. The first shielding sleeve 20a binds the first power wire group 1 into a bundle. The second shielding sleeve 20b binds the second power wire group 2 into a bundle. The third shielding sleeve 20c binds the third power wire group 3 into a bundle.

Thereby, the shielding sleeves 20a, 20b, 20c are in the state of being inserted among the first to third power wire groups 1 to 3. The shielding sleeves 20a, 20b, 20c are connected to the detection circuit 25, and their potentials are a ground potential.

The tape 23 is wound around the shielding sleeves 20a, 20b, 20c at a constant pitch to bind the shielding sleeves 20a, 20b, 20c into a single bundle. Thereby, the tape 23 binds the first shielding sleeve 20a, the second shielding sleeve 20b and the third shielding sleeve 20c into a bundle, and makes them into a single electric wire bundle, like in the case of Embodiment 1.

The configuration of the electric wire protecting device of the embodiment is as described above. Next, descriptions will be provided for how a weak electric arc may occur in the electric wire protecting device of the embodiment.

As described above, the shielding sleeves 20a, 20b, 20c are provided among the first to third power wire groups 1, 2, 3. For this reason, the power wires of any one of the first to third power wire groups 1, 2, 3 no longer rub against the power wires of the other power wire groups. Instead, the shielding sleeves 20a, 20b, 20c of the power wire groups 1, 2, 3 wear against and damage each other. Incidentally, in the embodiment, too, there is likelihood that in any power wire group, the insulations of some power wires wear against and damage each other. This case, however, will not lead to the occurrence of an electric arc for the same reason as described for Embodiment 1 (this is the case with Embodiments 3, 4 which will be described).

As a result, in one of the shielding sleeves 20a, 20b, 20c, a weak electric arc may occur between an internal conductor of the power wire whose insulation is damaged and the shielding sleeve. In that case, the energy of the electric arc is controlled by the current controlling resistor 24 (the resistance value of the current controlling resistor 24 is adjusted such that when the electric arc occurs, the energy is weak enough not to penetrate the shielding sleeves 20a, 20b, 20c). When the weak electric arc occurs, the voltage inputted into a comparator (the comparator 19 shown in FIG. 3) in the detection circuit 25 becomes equal to or greater than the reference voltage value Vref. Thereby, the comparator detects the occurrence of the electric arc, and outputs the trigger signal.

As described above, the embodiment makes it possible to assemble the power wire groups, which are different in potential from one another, into the same single bundle. This bundle of power wires can be installed even in narrow spaces inside an aircraft. Furthermore, the embodiment makes the power wires at any potential no longer rub against the power wires at the other potentials, and thereby can reduce a risk of the occurrence of an electric arc. Moreover, since the embodiment enables a weak electric arc to be detected using the shielding sleeves 20a, 20b, 20c and the detection circuit 25 once the weak electric arc occurs, and accordingly makes it possible to reduce manufacturing costs. Besides, since the embodiment uses the shielding sleeves 20a, 20b, 20c which are made of the metal and very good at heat transfer, unlike in a case where an arc protection sleeve is used, the embodiment no longer allows the power wires to rise in temperature.

It should be noted that: each time a weak electric arc occurs, the embodiment also records the occurrence of the weak electric arc based on the output information of the detection circuit 15, like in the case of Embodiment 1; and thus, the embodiment is capable of informing the necessity of replacing the power wires before power wires rub against each other to develop into an ark fault among the power wire group.

Embodiment 3

Figure 8:
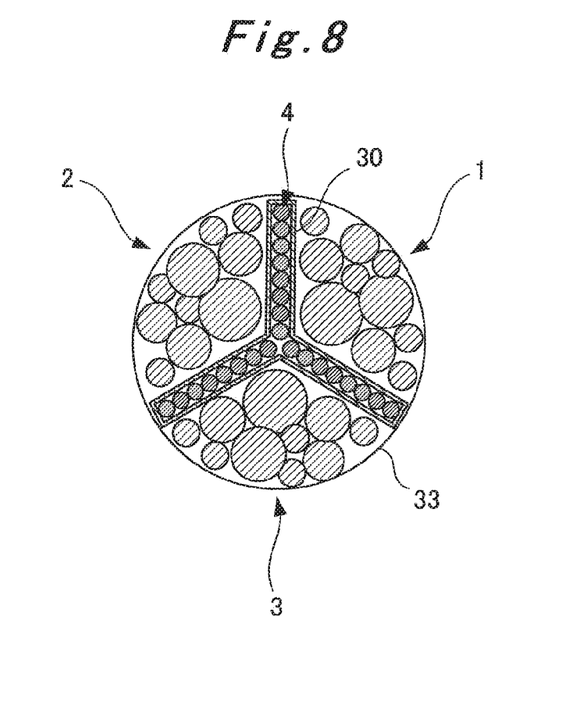
FIG. 8 is a cross-sectional view for describing a configuration of an electric wire protecting device of Embodiment 3 of the present invention.

Using FIG. 8, descriptions will be provided for an electric wire protecting device of the embodiment. FIG. 8 is a cross-sectional view for describing a configuration of the electric wire protecting device of the embodiment. In the embodiment, three-phase alternating-current power wires and weak-current wires are bound into a bundle. Incidentally, the weak-current wires mean signal wires, neutral wires or DC wires.

The electric wire protecting device of the embodiment includes a thin-film spacer 30 and a tape 33, among other things. The tape 33 is the same as the tape 13 of Embodiment 1. For this reason, descriptions for the tape 33 will be omitted.

The thin-film spacer 30 extends in a direction of the extension of a weak-current wire group 4 which is an assembly of the weak-current wires, and the first to three power wire groups 1, 2, 3, as well as is inserted into boundary portions between the first to three power wire groups 1, 2, 3.

To put it in detail, the thin-film spacer 30 is an insulating hollow member (made of a resin), and includes a hollow portion formed to extend in the direction of the extension of the weak-current wire group 4 and the first to three power wire groups 1, 2, 3, and to be inserted into the boundary portions between the first to three power wire groups 1, 2, 3. The weak-current wire group 4 is arranged in the hollow portion (in a way to spread the weak-current wire group 4 substantially evenly throughout the hollow portion).

The configuration of the electric wire protecting device of the embodiment is as described above. Next, descriptions will be provided for how a weak electric arc may occur in the electric wire protecting device of the embodiment.

As described above, the thin-film spacer 30 including the weak-current wire group 4 within it is provided among the first to third power wire groups 1, 2, 3. For this reason, the power wires of any one of the first to third power wire groups 1, 2, 3 no longer rub against the power wires of the other power wire groups. Instead, a power wire in one of the first to third power wire groups 1, 2, 3 wears against and damages the thin-film spacer 30 and a weak-current wire.

As a result, a weak electric arc may occur between an internal conductor of the power wire whose insulation is damaged and an internal conductor of the weak-current wire (the electric arc is suppressed into a weak one since weak-current wires are generally thin-wire conductors). Once the weak electric arc occurs, an abnormal value (current value) is observed in the weak-current wire. Thereby, it can be detected whether or not the weak-current electric arc occurs. Incidentally, this observation and detection are performed using an overvoltage detection circuit (whose illustration is omitted) connected to the weak-current wires (in the conventional practice, an overvoltage detection circuit is connected to weak-current wires).

As described above, the embodiment makes it possible to assemble the power wires and the weak-current wires, which are different in potential from one another, into the same single bundle. This bundle of power wires and weak-current wires can be installed even in narrow spaces inside an aircraft. Furthermore, the embodiment makes the wires at any potential no longer rub against the wires at the other potentials, and thereby can reduce a risk of the occurrence of an electric arc. Moreover, since the embodiment enables a weak electric arc to be detected using the weak-current wires and the overvoltage detection circuit connected to the weak-current wires once the weak electric arc occurs, and accordingly makes it possible to reduce manufacturing costs. Thereby, the embodiment makes it possible to know how much the insulations deteriorate before the deterioration of the insulations leads to a large electric arc (an arc fault) between the AC power wires.

Embodiment 4

Figure 9:
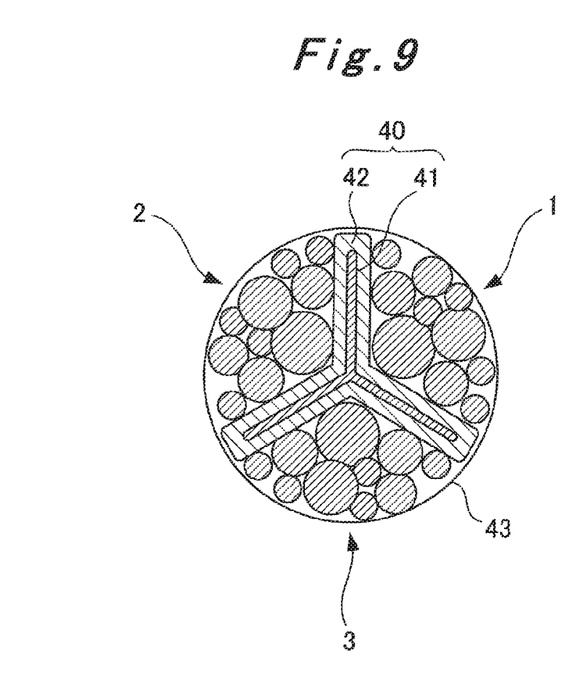
FIG. 9 is a cross-sectional view for describing a configuration of an electric wire protecting device of Embodiment 4 of the present invention.

Using FIG. 9, descriptions will be provided for an electric wire protecting device of the embodiment. FIG. 9 is a cross-sectional view for describing a configuration of the electric wire protecting device of the embodiment.

The electric wire protecting device of the embodiment includes a thin-film spacer 40 and a tape 43, among other things. The tape 43 is the same as the tape 13 of Embodiment 1. For this reason, descriptions for the tape 33 will be omitted.

The thin-film spacer 40 extends in a direction of the extension of the first to three power wire groups 1, 2, 3, and is inserted into boundary portions between the first to three power wire groups 1, 2, 3.

To put it in more detail, the thin-film spacer 40 is a heat distribution measurement film 41 covered with a cover (resin cover) 42 made of an insulating material, where the heat distribution measurement film 41 is designed to change its color according to changes in temperature, extends in the direction of the extension of the first to three power wire groups 1, 2, 3, and is inserted into the boundary portions between the first to three power wire groups 1, 2, 3.

The configuration of the electric wire protecting device of the embodiment is as described above. Next, descriptions will be provided for how a weak electric arc may occur in the electric wire protecting device of the embodiment.

An electric arc may occur when a power wire in any of the power wire groups rubs against and damages the thin-film spacer 40 so that the internal conductor of a power wire in one power wire group and an internal conductor of a power wire in another power wire group come close to each other. Before an arc fault occurs, intermittent weak electric arcs may occur in succession. While the intermittent weak electric arcs occur in succession (for several weeks to several months), the heat distribution measurement film 41 records rises in temperature (the heat distribution measurement film 41 changes its color). For this reason, when a periodic maintenance is performed, whether or not there is a sign of an arc fault (whether or not weak electric arcs have occurred) can be checked by seeing how much the heat distribution measurement film 41 has changed its color. Incidentally, the insulating cover with which the heat distribution measurement film 41 is covered needs to be translucent for the purpose that it can be easily checked how much the heat distribution measurement film 41 has changed its color.

As described above, the embodiment makes it possible to assemble the power wires, which are different in potential from one another, into the same single bundle. This bundle of power wires can be installed even in narrow spaces inside an aircraft. Furthermore, the embodiment makes the wires at any potential no longer rub against the wires at the other potentials, and thereby can reduce a risk of the occurrence of an electric arc. Moreover, the embodiment enables a weak electric arc to be detected using the heat distribution measurement film 41 once the weak electric arc occurs. Thereby, the embodiment makes it possible to know how much the insulations deteriorate before the deterioration of the insulations leads to a large electric arc (an arc fault) between the AC power wires.

The present invention is suitable as the electric wire protecting device for detecting an electric arc which may occur in an electric wire in an aircraft, a train, an automobile, a ship, a photovoltaic power generating system, and the like.

REFERENCE SIGNS LIST

1 FIRST POWER WIRE GROUP
2 SECOND POWER WIRE GROUP
3 THIRD POWER WIRE GROUP
4 WEAK-CURRENT WIRE GROUP
10, 30, 40 THIN-FILM SPACER
11 METAL FILM
12, 42 RESIN COVER
13, 23, 33, 43 TAPE
14, 24 CURRENT CONTROLLING RESISTOR
15, 25 DETECTION CIRCUIT
16 RECTIFIER DIODE
17 SMOOTHING CIRCUIT
18 INPUT RESISTOR
19 COMPARATOR
20a FIRST SHIELDING SLEEVE
20b SECOND SHIELDING SLEEVE
20c THIRD SHIELDING SLEEVE
41 HEAT DISTRIBUTION MEASUREMENT FILM

The invention claimed is:

1. An electric wire protecting device comprising:
  a power wire group which is an assembly of one or more power wires at a same potential;
  a tape for binding a plurality of the power wire groups at different potentials from one another into one bundle at a constant pitch; and
  a spacer extending in a direction of extension of the power wire groups, inserted in boundaries between the power wire groups; and including a conductor within the spacer.

2. The electric wire protecting device according to claim 1, wherein
  the spacer includes
    a conductive film extending in the direction of the extension of the power wire groups, and inserted in the boundaries between the power wire groups, and
    an insulating cover for covering the film,
  the electric wire protecting device further comprising:
  a detection circuit for detecting whether or not an electric arc occurs based on a current flowing in the film.

3. The electric wire protecting device according to claim 2, wherein
  the film is connected to the detection circuit via a resistor for controlling a short-circuit current such that when an electric arc occurs, no energy penetrates through the film.

4. The electric wire protecting device according to claim 1, wherein
  the spacer is an insulating hollow member, and including
    a hollow portion formed to extend in the direction of the extension of the power wire groups, and to be inserted into the boundaries between the power wire groups, and
  a weak-current wire group which is an assembly of weak-current wires extending in the direction of the extension of the power wire groups is arranged in the hollow portion.

5. The electric wire protecting device according to claim 4, further comprising:
  a detection circuit, connected to the weak-current wire group, for detecting whether or not an electric arc occurs based on a current flowing in the weak-current wire group.

6. An electric wire protecting device comprising:
  a power wire group which is an assembly of one or more power wires at a same potential;
  a tape for binding a plurality of the power wire groups at different potentials from one another into one bundle at a constant pitch; and
  a spacer extending in a direction of extension of the power wire groups, and inserted in boundaries between the power wire groups, wherein
  the spacer includes shielding sleeves binding the power wire groups, respectively,
  the electric wire protecting device further comprising:
  a detection circuit for detecting whether or not an electric arc occurs based on currents flowing in the shielding sleeves.

7. The electric wire protecting device according to claim 6, wherein
  the shielding sleeves are connected to the detection circuit via a resistor for controlling a short-circuit current such that when an electric arc occurs, no energy penetrates through the shielding sleeves.

8. An electric wire protecting device comprising:
  a power wire group which is an assembly of one or more power wires at a same potential;
  a tape for binding a plurality of the power wire groups at different potentials from one another into one bundle at a constant pitch; and
  a spacer extending in a direction of extension of the power wire groups, and inserted in boundaries between the power wire groups, wherein
  the space includes
    a heat distribution measurement film extending in the direction of the extension of the power wire groups, inserted in the boundaries between the power wire groups, and designed to change its color according to changes in temperature, and
    an insulating cover for covering the heat distribution measurement film.

* * * * *